(12) United States Patent
Bedell et al.

(10) Patent No.: US 7,074,686 B2
(45) Date of Patent: Jul. 11, 2006

(54) METHOD OF CREATING HIGH-QUALITY RELAXED SIGE-ON-INSULATOR FOR STRAINED SI CMOS APPLICATIONS

(75) Inventors: Stephen W. Bedell, Wappingers Falls, NY (US); Jack O. Chu, Manhasset Hills, NY (US); Keith E. Fogel, Mohegan Lake, NY (US); Steven J. Koester, Ossining, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 10/824,289

(22) Filed: Apr. 14, 2004

(65) Prior Publication Data

US 2004/0192069 A1    Sep. 30, 2004

Related U.S. Application Data

(62) Division of application No. 10/055,138, filed on Jan. 23, 2002, now Pat. No. 6,805,962.

(51) Int. Cl.
*H01L 21/331* (2006.01)
*H01L 21/8222* (2006.01)

(52) U.S. Cl. .................. 438/312; 438/530; 438/938

(58) Field of Classification Search ........... 438/312, 438/502, 509, 530, 778, 938
See application file for complete search history.

(56) References Cited

U.S. PATENT DOCUMENTS

| | | | |
|---|---|---|---|
| 4,866,498 A | 9/1989 | Myers | |
| 5,461,243 A | 10/1995 | Ek et al. | |
| 5,563,428 A | 10/1996 | Ek et al. | |
| 5,667,586 A | 9/1997 | Ek et al. | |
| 5,759,898 A | 6/1998 | Ek et al. | |
| 5,846,867 A | 12/1998 | Gomi et al. | |
| 6,118,151 A | 9/2000 | Tsutsu | |
| 6,190,975 B1 | 2/2001 | Kubo et al. | |
| 6,515,335 B1 | 2/2003 | Christiansen et al. | |
| 6,607,948 B1 * | 8/2003 | Sugiyama et al. | 438/151 |
| 2002/0030227 A1 | 3/2002 | Bulsara et al. | |

* cited by examiner

*Primary Examiner*—Phuc T. Dang
(74) *Attorney, Agent, or Firm*—Scully, Scott, Murphy & Presser, P.C.; Robert M. Trepp, Esq.

(57) ABSTRACT

A method of forming a thin, high-quality relaxed SiGe-on-insulator substrate material is provided which first includes forming a SiGe or pure Ge layer on a surface of a first single crystal Si layer which is present atop a barrier layer that is resistant to the diffusion of Ge. Optionally forming a Si cap layer over the SiGe or pure Ge layer, and thereafter heating the various layers at a temperature which permits interdiffusion of Ge throughout the first single crystal Si layer, the optional Si cap and the SiGe or pure Ge layer thereby forming a substantially relaxed, single crystal SiGe layer atop the barrier layer. Additional SiGe regrowth and/or formation of a strained epi-Si layer may follow the above steps. SiGe-on-insulator substrate materials as well as structures including at least the SiGe-on-insulator substrate materials are also disclosed herein.

34 Claims, 4 Drawing Sheets

METHOD OF CREATING HIGH-QUALITY RELAXED SIGE-ON-INSULATOR FOR STRAINED SI CMOS APPLICATIONS

RELATED APPLICATION

This application is a divisional of U.S. application Ser. No. 10/055,138, filed Jan. 23, 2002 now U.S. Pat. No. 6,805,962.

FIELD OF THE INVENTION

The present invention relates to a method of fabricating a semiconductor substrate material, and more particularly to a method of fabricating thin, high-quality, substantially relaxed SiGe-on-insulator substrate materials. The relaxed SiGe-on-insulator substrate materials of the present invention can be used as a lattice mismatched template for creating a strained Si layer thereon by subsequent Si epitaxial overgrowth. Such strained Si layers have high carrier mobility and are useful in high-performance complementary metal oxide semiconductor (CMOS) applications. The present invention is also directed to SiGe-on-insulator substrate materials as well as structures which include at least the substrate materials.

BACKGROUND OF THE INVENTION

In the semiconductor industry, there has recently been a high-level of activity using strained Si-based heterostructures to achieve high mobility structures for CMOS applications. Traditionally, the prior art method to implement this has been to grow strained Si layers on thick (on the order of from about 1 to about 5 micrometers) relaxed SiGe buffer layers.

Despite the high channel electron mobilities reported for prior art heterostructures; the use of thick SiGe buffer layers has several noticeable disadvantages associated therewith. First, thick SiGe buffer layers are not typically easy to integrate with existing Si-based CMOS technology. Second, the defect densities, including threading dislocations (TDs) and misfit dislocations, are from about $10^5$ to about $10^8$ defects/cm$^2$ which are still too high for realistic VSLI (very large scale integration) applications. Thirdly, the nature of the prior art structure precludes selective growth of the SiGe buffer layer so that circuits employing devices with strained Si, unstrained Si and SiGe materials are difficult, and in some instances, nearly impossible to integrate.

In order to produce relaxed SiGe material on a Si substrate, prior art methods typically grow a uniform, graded or stepped, SiGe layer to beyond the metastable critical thickness (i.e., the thickness beyond which dislocations form to relieve stress) and allow misfit dislocations to form, with the associated threading dislocations, through the SiGe buffer layer. Various buffer structures have been used to try to increase the length of the misfit dislocation section in the structures and thereby to decrease the TD density.

Another prior art approach, such as described in U.S. Pat. Nos. 5,461,243 and 5,759,898, both to Ek, et al., provides a structure with a strained and defect free semiconductor layer wherein a new strain relieve mechanism operates whereby the SiGe buffer layer relaxes without the generation of TDs within the SiGe layer.

Neither the conventional approaches, nor the alternative approaches described in the Ek, et al. patents provide a solution that substantially satisfies the material demands for device applications, i.e., sufficiently low TD density, substantially little or no misfit dislocation density and control over where the TD defects will be formed. As such, there is a continued need for developing a new and improved method of forming relaxed. SiGe-on-insulator substrate materials which are thermodynamically stable against defect production.

SUMMARY OF THE INVENTION

One object of the present invention is to provide a method of fabricating thin, high-quality, substantially relaxed SiGe-on-insulator substrate materials.

Another object of the present invention is to provide a method of fabricating thin, high-quality, substantially relaxed SiGe-on-insulator substrate materials which are thermodynamically stable against defect production such as misfit and threading dislocations.

A further object of the present invention is to provide a method of fabricating thin, high-quality, substantially relaxed SiGe-on-insulator substrate materials which are compatible with CMOS processing steps.

A yet further object of the present invention is to provide a method of fabricating thin, high-quality, substantially relaxed SiGe-on-insulator substrate materials which can then be used as lattice mismatched templates, i.e., substrates, for forming strained Si layers.

A still further object of the present invention is to provide strained Si/substantially relaxed SiGe-on-insulator structures which have high carrier mobility and are useful in high-performance CMOS applications.

These and other objects and advantages are achieved in the present invention by utilizing a method which includes first forming a SiGe or pure Ge layer on a surface of a first single crystal Si layer, said first single crystal Si layer is present atop a barrier layer that is resistant to Ge diffusion; and thereafter a heating step is performed at a temperature which permits interdiffusion of Ge throughout the first single crystal Si layer and the SiGe or pure Ge layer thereby forming a substantially relaxed, single crystal SiGe layer atop the barrier layer. It is noted that the substantially relaxed, single crystal layer is comprised of a homogeneous mixture of the SiGe or pure Ge layer as well as the first single crystal Si layer.

Following these steps of the present invention, a strained Si layer may be grown epitaxially atop the substantially relaxed single crystal SiGe layer to form a strained Si/relaxed SiGe-containing heterostructure that can be used in a variety of high-performance CMOS applications.

In some embodiments of the present invention, the first single crystal Si and barrier layer are components of a silicon-on-insulator (SOI) substrate. In other embodiments, the barrier layer is formed atop a surface of a semiconductor substrate, and thereafter the first single crystal Si layer is formed atop the barrier layer. The latter substrate material is a non-SOI substrate.

The present method also contemplates the use of barrier layers that are unpatterned (i.e., barrier layers that are continuous) or patterned (i.e., discrete and isolated barrier regions or islands which are surrounded by semiconductor material).

In yet another embodiment of the present invention, a Si cap layer is formed atop the SiGe or pure Ge layer prior to heating the structure. This embodiment of the present invention provides thermodynamically stable (in terms of preventing defect production) thin, substantially relaxed SiGe-on-insulator substrate materials. It is noted that the term "thin" when used in conjunction with the high-quality, substantially relaxed SiGe-on-insulator substrate material, denotes that the SiGe layer has a thickness of about 2000 nm or less, with a thickness of from about 10 to about 200 nm being more highly preferred.

Another aspect of the present invention relates to the SiGe-on-insulator substrate material that is formed utilizing the above-mentioned processing steps. Specifically, the inventive substrate material comprises a Si-containing substrate; an insulating region that is resistant to Ge diffusion present atop the Si-containing substrate; and a substantially relaxed SiGe layer present atop the insulating region, wherein the substantially relaxed SiGe layer has a thickness of about 2000 nm or less.

A yet further aspect of the present invention relates to a heterostructure which includes at least the above-mentioned substrate material. Specifically, the heterostructure of the present invention comprises a Si-containing substrate; an insulating region that is resistant to Ge diffusion present atop the Si-containing substrate;

a substantially relaxed SiGe layer present atop the insulating region, wherein the substantially relaxed SiGe layer has a thickness of about 2000 nm or less; and a strained Si layer formed atop the substantially relaxed SiGe layer.

Other aspects of the present invention relate to superlattice structures as well as templates for other lattice mismatched structures which include at least the SiGe-on-insulator substrate material of the present invention.

DETAILED DESCRIPTION OF THE INVENTION

Figure 1A:
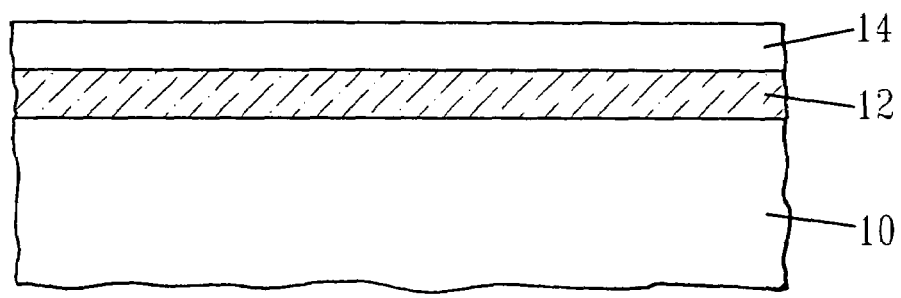
FIGS. 1A–1D are pictorial representations (through cross-sectional views) showing the basic processing steps that are employed in the present invention in fabricating a thin, high-quality, substantially relaxed SiGe-on-insulator substrate material wherein the initial substrate includes an unpatterned diffusion barrier region.

The present invention, which provides a method of fabricating thin, high-quality, substantially relaxed SiGe-on-insulator substrate materials which can then serve as a lattice mismatched template for subsequent overgrowth of epitaxial Si, will now be described in greater detail by referring to the drawings the accompany the present application. It is noted that in the accompanying drawings like and/or corresponding elements are referred to by like reference numerals.

Figure 2A:
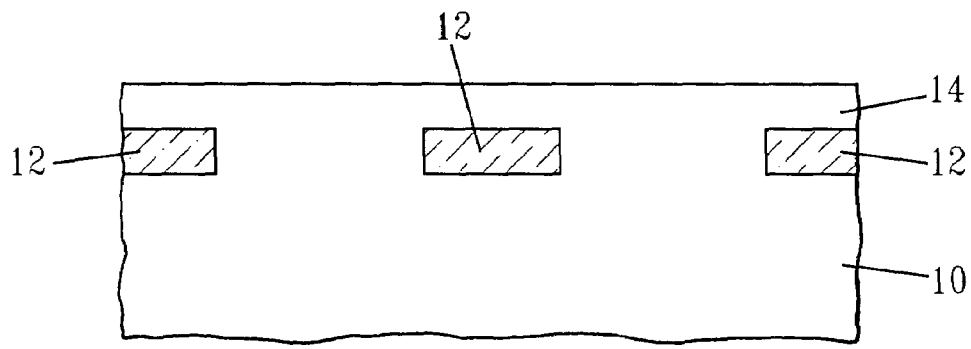
FIGS. 2A–2D are pictorial representations (through cross-sectional views) showing the basic processing steps that are employed in an alternative embodiment of the present invention in fabricating a thin, high-quality, substantially relaxed SiGe-on-insulator substrate material wherein the initial substrate includes a patterned diffusion barrier region.

Reference is first made to FIG 1A and FIG. 2A which show initial substrate materials that can be employed in the present invention. Specifically, the initial substrate materials illustrated in FIGS. 1A and 2A each comprise Si-containing semiconductor substrate 10, barrier layer 12 which is resistant to Ge diffusion (hereinafter "barrier layer") present atop a surface of Si-containing semiconductor substrate 10 and first single crystal Si layer 14 having misfit and TD densities of less than about $1 \times 10^8$ defects/cm$^2$ present atop the barrier layer. The difference between the two initial structures depicted in the drawings is that, in FIG. 1A, the barrier layer is present continuously throughout the entire structure, whereas in FIG. 2A, the barrier layer is present as discrete and isolated regions or islands that are surrounded by semiconductor material, i.e., layers 10 and 14. Note that the initial structure shown in FIG. 1A thus includes an unpatterned barrier layer, whereas the initial structure of FIG. 2A includes a patterned barrier layer.

Notwithstanding whether the barrier layer is patterned or unpatterned, the initial structure may be a conventional silicon-on-insulator (SOI) substrate material wherein region 12 is a buried oxide region which electrically isolates first single crystal Si layer 14 from Si-containing substrate semiconductor substrate 10. The term "Si-containing" as used herein denotes a semiconductor substrate that includes at least silicon. Illustrative examples include, but are not limited to: Si, SiGe, SiC, SiGeC, Si/Si, Si/SiC, Si/SiGeC, and preformed silicon-on-insulators which may include any number of buried oxide (continuous, non-continuous or mixtures of continuous and non-continuous) regions present therein.

The SOI substrate may be formed utilizing conventional SIMOX (separation by ion implantation of oxygen) processes well known to those skilled in the art, as well as the various SIMOX processes mentioned in co-assigned U.S. patent applications Ser. No. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are being incorporated herein by reference. Note that the process disclosed in the '590 application can be employed herein to fabricate the patterned substrate shown in FIG. 2A. Alternatively, the SOI substrate material may be made using other conventional processes including, for example, a thermal bonding and cutting process.

In addition to SOI substrates, the initial substrates shown in FIGS. 1A and 2A may be a non-SOI substrate which is made using conventional deposition processes as well as lithography and etching (employed when fabricating a patterned substrate). Specifically, when non-SOI substrates are employed, the initial structure is formed by depositing a Ge diffusion barrier layer atop a surface of a Si-containing substrate, via conventional deposition or thermal growing processes, optionally patterning the barrier layer by employing conventional lithography and etching; and thereafter forming a single crystal Si layer atop the barrier layer using conventional deposition processes including chemical vapor deposition (CVD), plasma-assisted CVD, sputtering, evaporation, chemical solution deposition or epitaxial Si growth.

Barrier layer 12 of the initial structure shown in FIGS. 1A and 2A comprises any insulating material which is highly resistant to Ge diffusion. Examples of such insulating and Ge diffusion resistant materials include, but are not limited to: crystalline or non-crystalline oxides or nitrides.

The thickness of the various layers of the initial structure may vary depending on the process used in making the same. Typically, however, single crystal Si layer 14 has a thickness of from about 1 to about 2000 nm, with a thickness of from about 20 to about 200 nm being more highly preferred. In the case of barrier layer 12 (i.e., Ge diffusion resistant layer), that layer may have a thickness of from about 1 to about 1000 nm, with a thickness of from about 20 to about 200 nm being more highly preferred. The thickness of the Si-containing substrate layer, i.e., layer 10, is inconsequential to the present invention. It is noted that the thicknesses provided above are exemplary and by no ways limit the scope of the present invention.

Figure 1B:
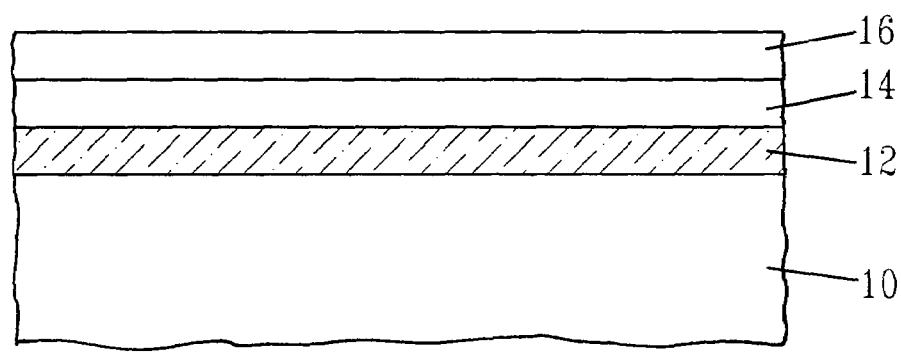
Figure 1C:
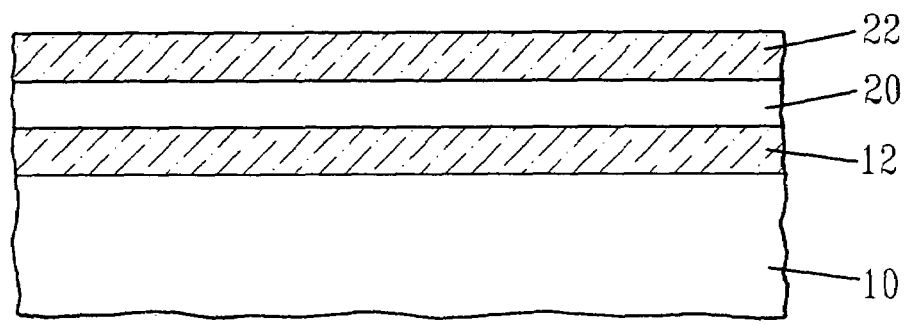
Figure 2B:
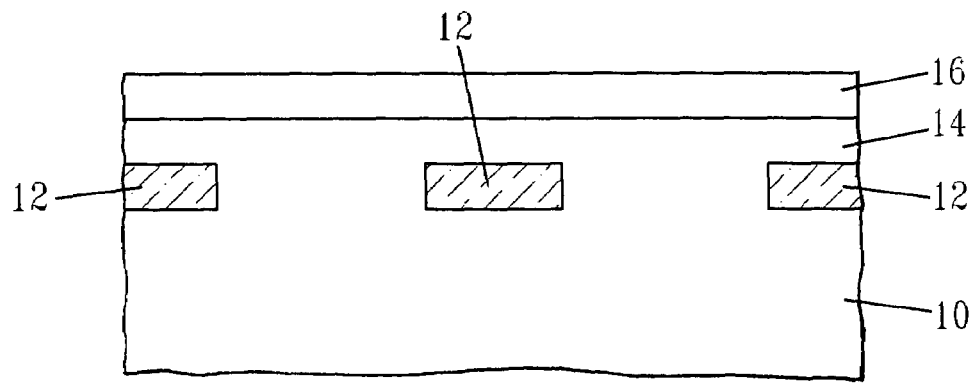
Figure 2C:
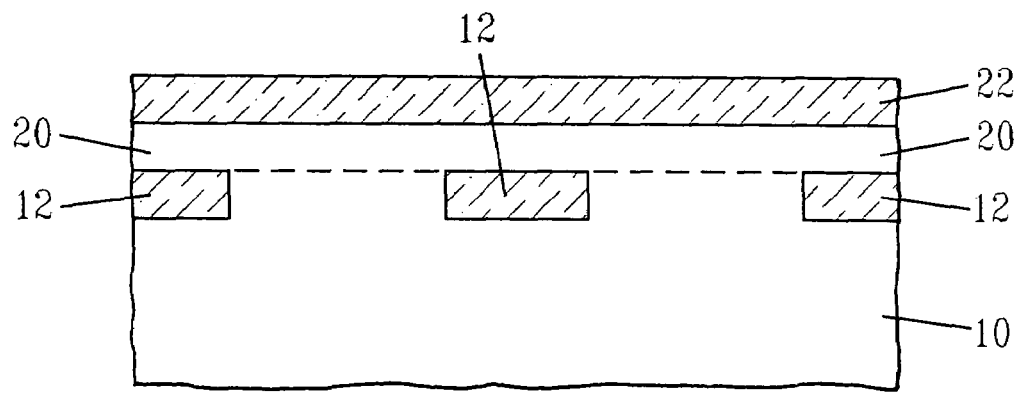

FIGS. 1B and 2B illustrate the structure that is formed after SiGe or pure Ge layer 16 is formed atop first single crystal Si layer 14. The term "SiGe layer" includes SiGe alloys that comprise up to 99.99 atomic percent Ge, whereas pure Ge includes layers that comprise 100 atomic percent Ge. When SiGe layers are employed, it is preferred that the Ge content in the SiGe layer be from about 0.1 to about 99.9 atomic percent, with a Ge atomic percent of from about 10 to about 35 being even more highly preferred.

In accordance with the present invention, the SiGe or Ge layer is formed atop first single crystal Si layer 14 using any conventional epitaxial growth method that is well known to those skilled in the art which is capable of (i) growing a thermodynamically stable (below a critical thickness) SiGe or pure Ge layer, or (ii) growing a SiGe or pure Ge layer that is metastable and free from defects, i.e., misfit and TD dislocations. Illustrative examples of such epitaxial growing processes that are capable of satisfy conditions (i) or (ii) include, but are not limited to: low-pressure chemical vapor deposition (LPCVD), ultra-high vacuum chemical vapor deposition (UHVCVD), atmospheric pressure chemical vapor deposition (APCVD), molecular beam (MBE) epitaxy and plasma-enhanced chemical vapor deposition (PECVD).

The thickness of the SiGe or pure Ge layer formed at this point of the present invention may vary, but typically layer 16 has a thickness of from about 10 to about 500 nm, with a thickness of from about 20 to about 200 nm being more highly preferred.

Figure 3A:
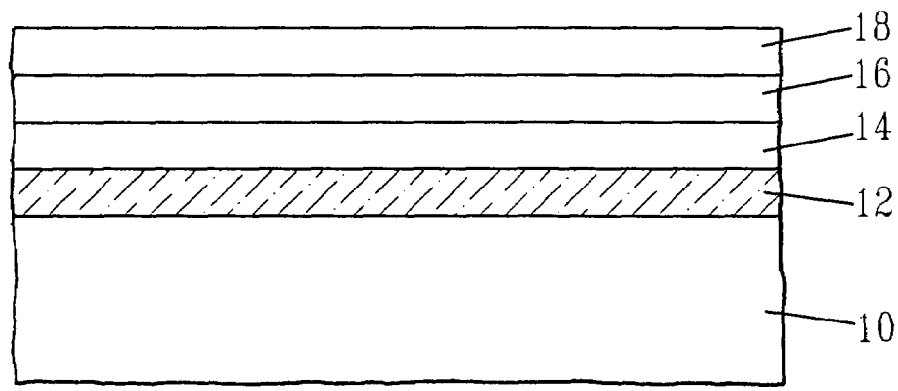
FIGS. 3A–3B are pictorial representations (through cross-sectional views) showing an alternative embodiment of the present invention wherein a Si cap layer is formed atop a Ge or SiGe layer which is formed on an unpatterned (3A) or patterned (3B) substrate.
Figure 3B:
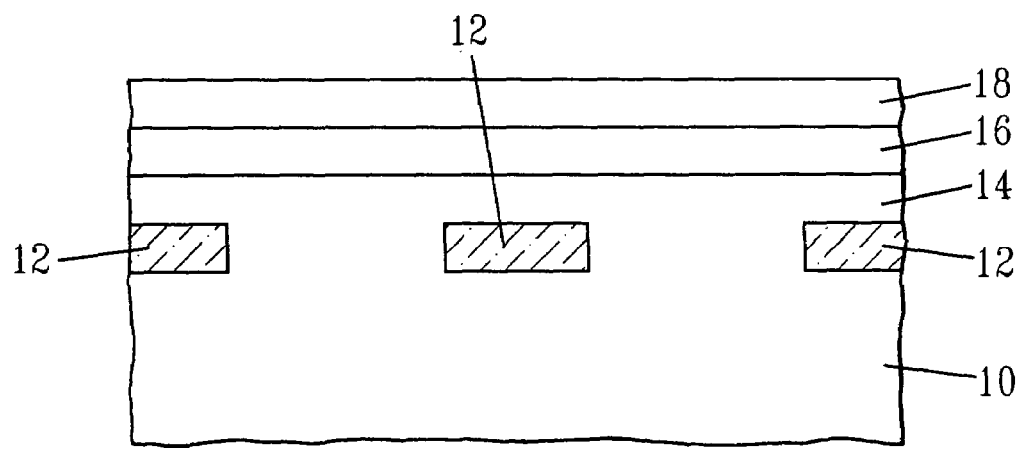

In an alternative embodiment of the present invention, see FIG. 3A–3B, optional cap layer 18 is formed atop SiGe or pure Ge layer 16 prior to performing the heating step of the present invention. The optional cap layer employed in the present invention comprises any Si material including, but not limited to: epitaxial silicon (epi-Si), amorphous silicon (a:Si), single or polycrystalline Si or any combination thereof including multilayers. In a preferred embodiment, the cap layer is comprised of epi Si. It is noted that layers 16 and 18 may, or may not, be formed in the same reaction chamber.

When present, optional cap layer 18 has a thickness of from about 1 to about 100 nm, with a thickness of from about 1 to about 30 nm being more highly preferred. The optional cap layer is formed utilizing any well-known deposition process including the epitaxial growth processes mentioned above.

In one embodiment of the present invention, it is preferred to form a pure Ge or SiGe (15 to 20 atomic percent Ge) layer having a thickness of from about 1 to about 2000 nm on the surface of a single crystal Si layer, and thereafter forming a Si cap layer having a thickness of from about 1 to about 100 nm atop the Ge or SiGe layer.

After forming the pure Ge or SiGe layer (or optional cap layer) atop the initial structure, the structure shown in either FIGS. 1B, 2B, 3A or 3B is then heated, i.e., annealed, at a temperature which permits interdiffusion of Ge throughout first single crystal Si layer 14, SiGe or pure Ge layer 16 and, if present, the optional Si cap thereby forming substantially relaxed, single crystal SiGe layer 20 atop said barrier layer. Note that oxide layer 22 is formed atop layer 20 during the heating step. This oxide layer is typically, but not always, removed from the structure after the heating step using a conventional wet etch process wherein a chemical etchant such as HF that has a high selectivity for removing oxide as compared to SiGe is employed.

Note that when the oxide layer is removed, a second single crystal Si layer can be formed atop layer 20 and the above processing steps of the present invention may be repeated any number of times to produce a multilayered relaxed SiGe substrate material.

The oxide layer formed after the heating step of the present invention has a variable thickness which may range from about 10 to about 1000 nm, with a thickness of from about 20 to about 500 nm being more highly preferred.

Specifically, the heating step of the present invention is an annealing step which is performed at a temperature of from about 900° to about 1350° C., with a temperature of from about 1200° to about 1335° C. being more highly preferred. Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The heating step may be carried out for a variable period of time which typically ranges from about 10 to about 1800 minutes, with a time period of from about 60 to about 600 minutes being more highly preferred. The heating step may be carried out at a single targeted temperature, or various ramp and soak cycles using various ramp rates and soak times can be employed.

The heating step is performed under an oxidizing ambient to achieve the presence of a surface oxide layer, i.e., layer 22, which acts as a diffusion barrier to Ge atoms. Therefore, once the oxide layer is formed on the surface of the structure, Ge becomes trapped between barrier layer 12 and oxide layer 22. As the surface oxide increases in thickness, the Ge becomes more uniformly distributed throughout layers 14, 16, and optionally 18, but it is continually and efficiently rejected from the encroaching oxide layer. So as the (now homogenized) layers are thinned during this heating step, the relative Ge fraction increases. Efficient thermal mixing is achieved in the present invention when the heating step is carried out at a temperature of from about 1200° to about 1320° C. in a diluted oxygen-containing gas.

It is also contemplated herein to use a tailored heat cycle which is based upon the melting point of the SiGe layer. In such an instance, the temperature is adjusted to tract below the melting point of the SiGe layer.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

The role of the heating step of the present invention is (1) to allow Ge atoms to diffuse more quickly thereby maintaining a homogeneous distribution during annealing; and (2) to subject the ('initially') strained layer structure to a thermal budget which will facilitate an equilibrium configuration. After this heating step has been performed, the structure includes a uniform and substantially relaxed SiGe alloy layer, i.e., layer 20, sandwiched between barrier layer 12 and surface oxide layer 22.

In accordance with the present invention, relaxed SiGe layer 20 has a thickness of about 2000 nm or less, with a thickness of from about 10 to about 100 nm being more highly preferred. Note that the relaxed SiGe layer formed in the present invention is thinner than prior art SiGe buffer layers and has a defect density including misfits and TDs, of less than about $10^8$ defects/cm$^2$.

The relaxed SiGe layer formed in the present invention has a final Ge content of from about 0.1 to about 99.9 atomic percent, with an atomic percent of Ge of from about 10 to about 35 being more highly preferred. Another characteristic feature of relaxed SiGe layer 22 is that it has a measured lattice relaxation of from about 1 to about 100%, with a measured lattice relaxation of from about 50 to about 80% being more highly preferred.

Figure 1D:
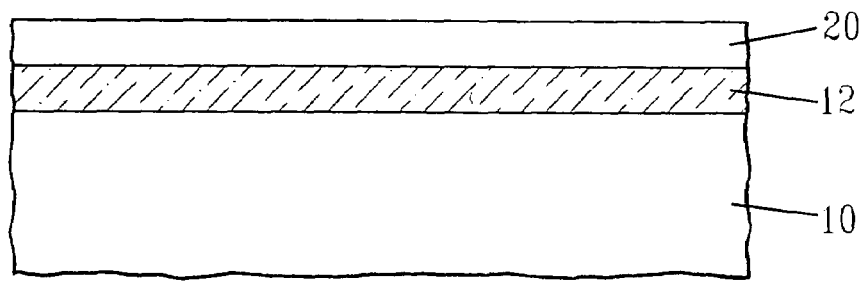
Figure 2D:
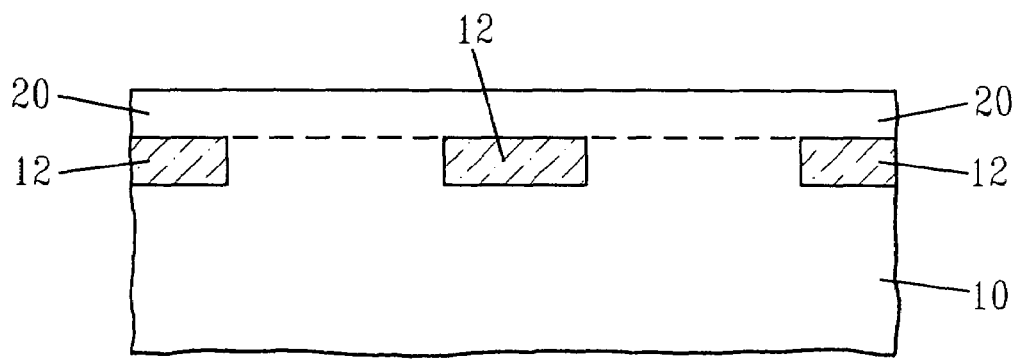

As stated above, surface oxide layer 22 may be stripped at this point of the present invention so as to provide the SiGe-on-insulator substrate material shown, for example, in FIGS. 1D or 2D (note that the substrate material does not include the cap layer since that layer has been used in forming the-relaxed SiGe layer).

Figure 4A:
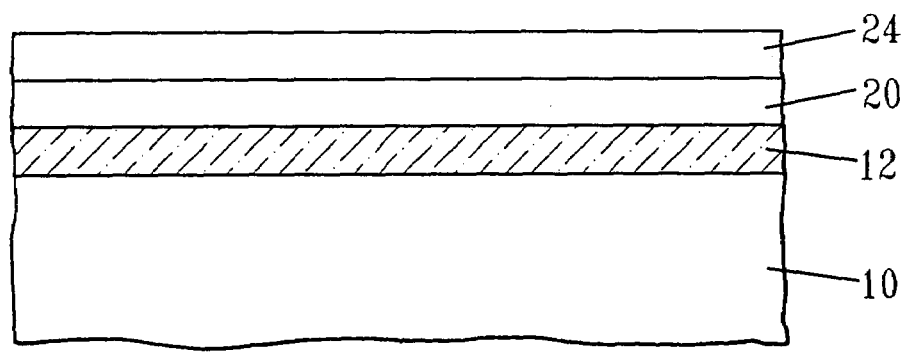
FIGS. 4A–4B are pictorial representations (through cross-sectional views) showing the formation of a strained Si layer on the thin, high-quality, substantially relaxed SiGe-on-insulator substrate material of FIGS. 1D and 2D, respectively.
Figure 4B:
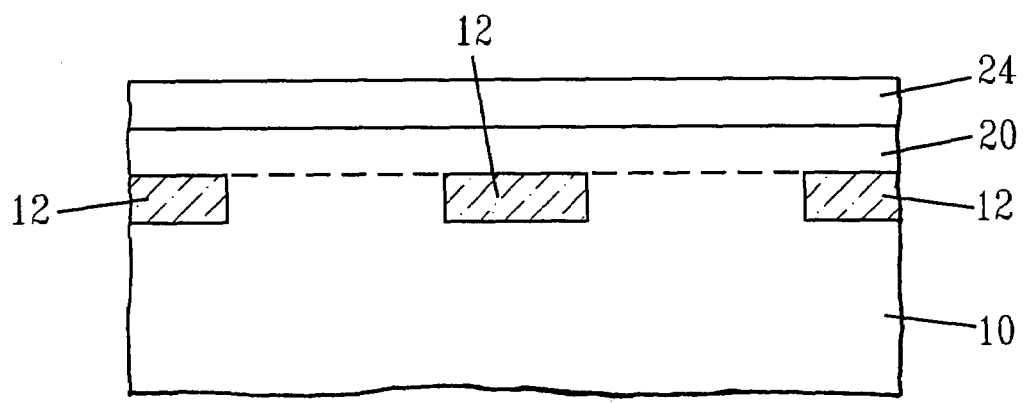

FIGS. 4A–B show the structure that is obtained after forming Si layer 24 atop SiGe layer of FIGS. 1D and 2D, respectively. Si layer 24 is formed using a conventional epitaxial deposition process well known in the art. The thickness of epi-Si layer 24 may vary, but typically, epi-Si layer 24 has a thickness of from about 1 to about 100 nm, with a thickness of from about 1 to about 30 nm being more highly preferred.

In some instances, additional SiGe can be formed atop relaxed SiGe layer 20 utilizing the above mentioned processing steps, and thereafter epi-Si layer 24 may be formed. Because layer 20 has a large in-plane lattice parameter as compared to epi-layer 24, epi-layer 24 will be strained in a tensile manner.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers Si and SiGe formed atop the substantially relaxed SiGe layer of the substrate material.

In the case of lattice mismatched structures, GaAs, GaP or other like compound would be formed atop the substantially relaxed SiGe layer of the inventive SiGe-on-insulator substrate material.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letter Patent is:

1. A method of producing a thin, high-quality, substantially relaxed SiGe-on-insulator substrate material comprising the steps of:
   (a) forming a SiGe or pure Ge layer on a surface of a first single crystal Si layer, said first single crystal Si layer is present atop a barrier layer that is resistant to Ge diffusion; and
   (b) heating said layers at a temperature which permits interdiffusion of Ge throughout said first single crystal Si layer and said SiGe or pure Ge layer thereby forming a substantially relaxed, single crystal SiGe layer atop said barrier layer.

2. The method of claim 1 wherein said first single crystal Si layer and said barrier layer are components of a silicon-on-insulator (SOI) substrate.

3. The method of claim 1 wherein said first single crystal Si layer and said barrier layer are components of a non-SOI substrate.

4. The method of claim 3 wherein said first single crystal Si layer has a thickness of from about 1 to about 2000 nm.

5. The method of claim 1 wherein said barrier layer is a patterned barrier layer.

6. The method of claim 1 wherein said barrier layer is an unpatterned barrier layer.

7. The method of claim 1 wherein said barrier layer comprises crystalline or non-crystalline oxides, or crystalline or non-crystalline nitrides.

8. The method of claim 1 wherein said barrier layer is a buried oxide region that is patterned or unpatterned.

9. The method of claim 1 wherein said barrier layer has a thickness of from about 1 to about 1000 nm.

10. The method of claim 1 wherein a SiGe layer comprising up to 99.99 atomic percent Ge is employed in step (a).

11. The method of claim 10 wherein said SiGe layer comprises from about 10 to about 35 atomic percent Ge.

12. The method of claim 1 wherein said SiGe or pure Ge layer is formed by an epitaxial growth process selected from the group consisting of low-pressure chemical vapor deposition, atmospheric pressure chemical vapor deposition, ultra-high vacuum chemical vapor deposition, molecular beam epitaxy, and plasma-enhanced chemical vapor deposition.

13. The method of claim 1 wherein a pure Ge layer is employed in step (a).

14. The method of claim 1 further comprising forming a Si cap layer atop said SiGe or pure Ge layer prior to performing step (b).

15. The method of claim 14 wherein said Si cap layer comprises epi-Si, a:Si, single or polycrystalline Si or any combination and multilayer thereof.

16. The method of claim 15 wherein said Si cap layer comprises epi-Si.

17. The method of claim 14 wherein said Si cap layer has a thickness of from about 1 to about 100 nm.

18. The method of claim 1 wherein a surface oxide layer forms during said heating step.

19. The method of claim 18 wherein said surface oxide layer has a thickness of from about 10 to about 1000 nm.

20. The method of claim 18 further comprising removing said surface oxide layer utilizing a wet chemical etch process.

21. The method of claim 1 wherein steps (a)–(b) are repeated any number of times.

22. The method of claim 1 wherein said heating step is carried out in an oxidizing ambient which comprises at least one oxygen-containing gas.

23. The method of claim 22 wherein said at least one oxygen-containing gas comprises $O_2$, NO, $N_2O$, ozone, air or mixtures thereof.

24. The method of claim 22 further comprising an inert gas, said inert gas being employed to dilute said at least one oxygen-containing gas.

25. The method of claim 1 wherein said heating step is performed at a temperature of from about 900° to about 1350° C.

26. The method of claim 25 wherein said heating step is performed at a temperature of from about 1200° to about 1335° C.

27. The method of claim 1 wherein said substantially relaxed SiGe layer has a thickness of about 2000 nm or less.

28. The method of claim 27 wherein said substantially relaxed SiGe layer has a thickness of from about 10 to about 100 nm.

29. The method of claim 1 wherein said substantially relaxed SiGe layer has a defect density of less than about $10^8$ defects/cm$^2$.

30. The method of claim 1 wherein said substantially relaxed SiGe layer has a measured lattice relaxation of from about 1 to about 100%.

31. The method of claim 30 wherein said substantially relaxed SiGe layer has a measured lattice relaxation of from about 50 to about 80%.

32. The method of claim 1 further comprising growing an additional SiGe layer atop said substantially relaxed SiGe layer.

33. The method of claim 32 further comprising forming a strained Si layer atop said additional SiGe layer.

34. The method of claim 1 further comprising forming a strained Si layer atop said substantially relaxed SiGe layer.

* * * * *

UNITED STATES PATENT AND TRADEMARK OFFICE
CERTIFICATE OF CORRECTION

| | | |
|---|---|---|
| PATENT NO. | : 7,074,686 B2 | Page 1 of 1 |
| APPLICATION NO. | : 10/824289 | |
| DATED | : July 11, 2006 | |
| INVENTOR(S) | : Stephen W. Bedell et al. | |

It is certified that error appears in the above-identified patent and that said Letters Patent is hereby corrected as shown below:

Title page, item (75) should read

(75) Inventors: Stephen W. Bedell, Wappingers Falls, NY (US); Jack O. Chu, Manhasset Hills, NY (US); Keith E. Fogel, Mohegan Lake, NY (US); Steven J. Koester, Ossining, NY (US); Devendra K. Sadana, Pleasantville, NY (US); John Albrecht Ott, Greenwood Lake, NY (US)

Signed and Sealed this
Tenth Day of November, 2015

Michelle K. Lee
*Director of the United States Patent and Trademark Office*